US008735183B2

(12) United States Patent
Corisis et al.

(10) Patent No.: US 8,735,183 B2
(45) Date of Patent: May 27, 2014

(54) SYSTEM IN PACKAGE (SIP) WITH DUAL LAMINATE INTERPOSERS

(75) Inventors: David J. Corisis, Nampa, ID (US); Matt Schwab, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1480 days.

(21) Appl. No.: 11/786,610

(22) Filed: Apr. 12, 2007

(65) Prior Publication Data

US 2008/0254571 A1 Oct. 16, 2008

(51) Int. Cl.
*G01R 31/26* (2006.01)

(52) U.S. Cl.
USPC ............... 438/15; 438/17; 438/107; 438/109

(58) Field of Classification Search
None
See application file for complete search history.

(56) References Cited

U.S. PATENT DOCUMENTS

| 6,710,457 | B1 | 3/2004 | Silverbrook |
| 6,858,892 | B2 | 2/2005 | Yamagata |
| 7,190,210 | B2 | 3/2007 | Azrai et al. |
| 2003/0214007 | A1* | 11/2003 | Tao et al. ............ 257/458 |
| 2003/0214029 | A1* | 11/2003 | Tao et al. ............ 257/723 |
| 2005/0093095 | A1 | 5/2005 | Yamagata |
| 2006/0043585 | A1 | 3/2006 | Sukegawa et al. |
| 2007/0170573 | A1* | 7/2007 | Kuroda et al. ........ 257/686 |

FOREIGN PATENT DOCUMENTS

| JP | 2005340316 | 12/2005 |
| JP | 2006140203 | 6/2006 |

OTHER PUBLICATIONS

Anna Fontanelli and Per Viklund; Design Challenges and Tools for System-in-Package (SIP) Applications.
Diasuke Mizoguchi, Noriyuki Miura, Mari Inoue, and Tadahiro Kuroda; Design of Transceiver Circuits for NRZ Signaling in Inductive Inter-chip Wireless Superconnect; 3-14-1 Japan.
Vern Solberg, Craig Mitchell, and Gordon Gray; IC Package Qualification Testing for Lead-Free Soldering; San Jose, CA. USA.

* cited by examiner

*Primary Examiner* — David E Graybill
(74) *Attorney, Agent, or Firm* — Fletcher Yoder, P.C.

(57) ABSTRACT

There is provided a semiconductor device assembly with an interposer and method of manufacturing the same. More specifically, in one embodiment, there is provided a semiconductor device assembly comprising a semiconductor substrate, at least one semiconductor die attached to the semiconductor substrate, an interposer disposed on the semiconductor die, and a controller attached to the interposer. There is also provided a method of manufacturing comprising forming a first subassembly by coupling a substrate and a semiconductor die, and forming second subassembly by attaching a controller to an interposer, and coupling the first subassembly to the second subassembly.

16 Claims, 3 Drawing Sheets

SYSTEM IN PACKAGE (SIP) WITH DUAL LAMINATE INTERPOSERS

BACKGROUND

1. Field of the Invention

Embodiments of the present invention relate generally to microelectronic packaging, and, more specifically, to multi-chip or system-in-package modules with semiconductor devices in a stacked arrangement.

2. Description of the Related Art

Packaging of electrical circuits is a key element in the technological development of any device containing electrical components. Integrated circuits are typically fabricated on a semiconductor wafer which may be diced to form a semiconductor die or chip. The die or chip may then be coupled to a substrate to form a package. Some packages may include multiple semiconductor dies coupled to a substrate to form Multi-Chip Module (MCM) devices. Certain MCM packages may include a processor, such that the package forms a mini-system. These self-contained mini-systems are commonly referred to as System-in-Package (SIP). SIP or MCM devices are commonly used in small electronic devices such as cell phones, digital music players, personal organizers, etc. One mechanism for increasing the amount of electrical circuitry in the package, without increasing the surface mount space necessary to house the components, is to stack the chips or dies on top of each other in a vertical fashion. The final step in formation of a SIP is to provide external interconnects to and/or encapsulate the stacked components.

Although the stacked arrangement in SIP and MCM devices minimizes the amount of surface area or "real estate" needed as compared to horizontally oriented packages, the stacked arrangement also introduces new challenges. The reduced surface area limits the horizontal placement of semiconductor dies and chips, and components that might not lend themselves to a stacked arrangement may be forced into a suboptimal location or orientation. Proper location and orientation are typically desirable to insure electrical conductivity between components and to reduce or eliminate any electrical interference. There are increasing difficulties in electrically connecting the various components to the substrate and each other because of the forced locations and orientations of the components due to the reduced surface area. For example, such components commonly use bond pads, in which the bond pads of one component are connected to a substrate or another component through the use of bond wires. The connectivity of the bond pads is limited by the space available on the mounting surface, and the bond pads of one component may not overlie the bond pads of another component or the contact pads of a substrate.

Other types of electronic connecting techniques, such as Fine-Pitch Ball Grid Array (FPGA) or Ball Grid Array (BGA) technology, may suffer similar problems. BGA packages implement conductive metal, such as solder, which is formed into spheres or balls and disposed on conductive ball pads on a substrate or other surface. The solder balls are generally configured into an array to provide mechanical as well as electrical interfaces between components and a substrate.

Additional challenges in designing SIP devices include the lack of vertical space between components and placement of components that may not lend themselves to embedding in a vertical stack. For example, vertical integration of components may lead to problems with encapsulating the package with a molding compound, resulting in air pockets and voids that may lead to conductivity gaps. Some components that may be required by the package, such as filter capacitors, may be limited to surface mounting and cannot be embedded elsewhere in the SIP or MCM stack, further complicating the space and connectivity issues.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Figure 1:
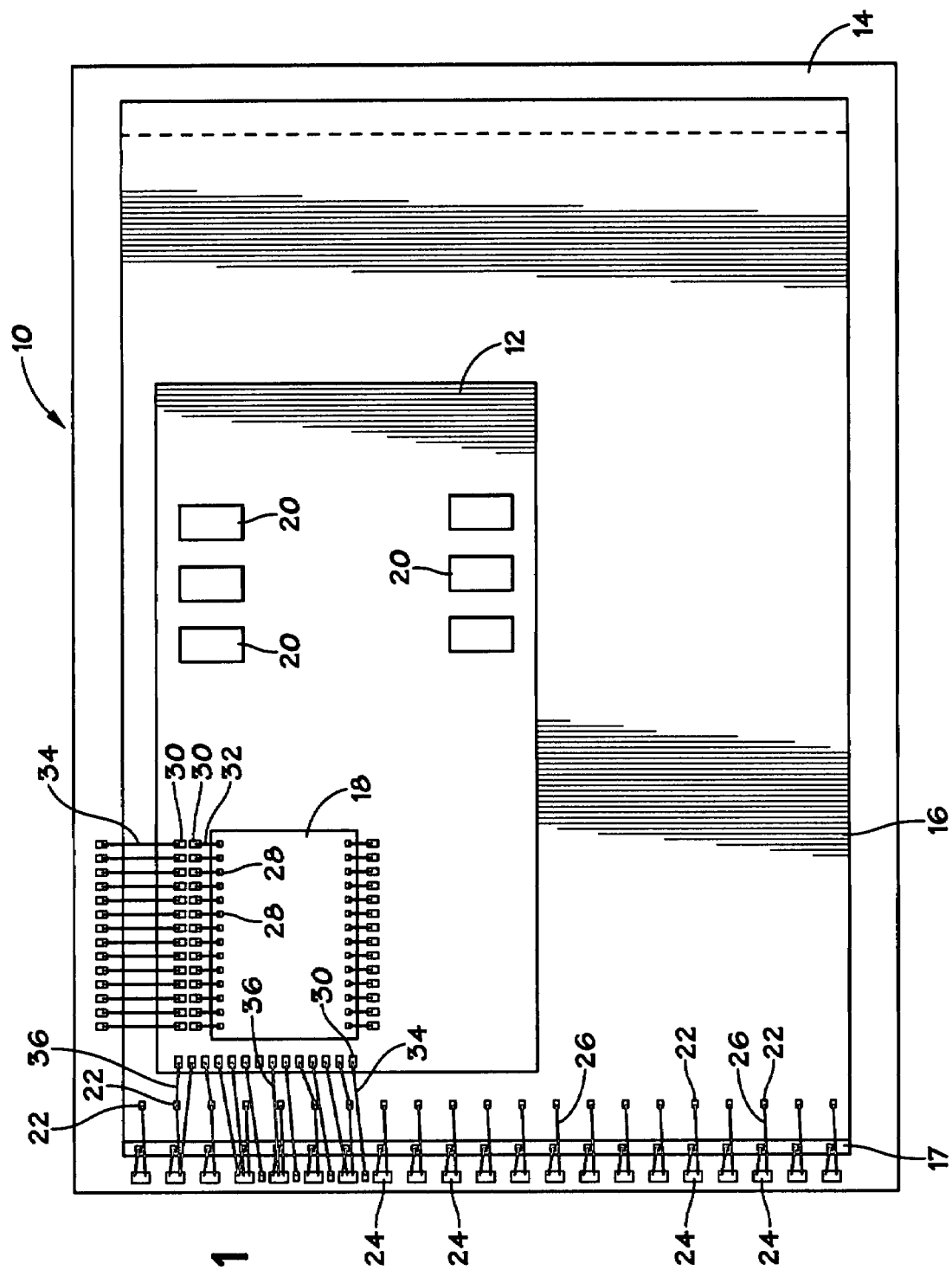
FIG. 1 illustrates a top view of a SIP stack in accordance with an embodiment of the present invention.

Turning now to the drawings, FIG. 1 depicts an embodiment of an assembled System-in-Package (SIP) stack 10. As used herein, the term "SIP stack" refers to a vertical stack of components assembled for use in a SIP, prior to providing external interconnects and/or encapsulation to form the SIP. As explained below, the SIP stack 10 may include different semiconductor dies or chips mounted vertically and may include one or more interposers 12, in accordance with embodiments of the present invention. The SIP stack 10 includes an interposer 12, a substrate 14, two memory dies 16 and 17, a processor or microcontroller 18, and six filter capacitors 20. As further discussed herein, the configuration of the SIP stack 10 may vary according to the size and functional requirements of the SIP. The SIP stack 10 may be intended for use in a variety of devices such as a computers, pagers, cellular phones, personal organizers, digital music players, control circuits, and so forth.

In the embodiment illustrated in FIG. 1, the memory dies 16 and 17 are NAND memory dies, which are also referred to as flash memory dies. However, NOR flash memory dies or any other type of memory may be used. The microcontroller 18 controls the processing of system functions and requests in the SIP stack 10, and may be any type of preexisting microcontroller or may be designed and manufactured for the specific requirements of the SIP. The microcontroller 18 and other components of the SIP stack 10 may be a part of subassemblies manufactured in accordance with embodiments of the present invention, as is explained further below.

The memory dies 16 and 17 are attached to the substrate 14. The substrate 14 may be formed from a dielectric material, such as a nonconductive polymer, glass, or ceramic, for instance. The memory dies 16 and 17 can be attached to the substrate 14 by epoxy, semiconductor tape, die attach film (DAF), or any desirable adhesive. As will be described below, the memory dies 16 and 17 and substrate 14 may be coupled together in a first sub-assembly before further assembly into the SIP stack 10. To incorporate the memory dies 16 and 17 into the SIP stack 10, each of the memory dies 16 and 17 are electrically coupled to the substrate 14 such that data and command signals can be directed to and from each of the memory dies 16 and 17 and throughout the SIP stack 10. As shown in FIG. 1, the memory dies 16 and 17 have multiple bond pads 22 to allow connection to the substrate and to components in the SIP stack 10. The bond pads 22 on the memory dies 16 and 17 are connected to contact pads 24 on the substrate 14 using bond wires 26. Other technologies, such as ball grid array (BGA) or fine pitch ball grid array (FGA) technologies, which employ conductive balls, may be used to connect the memory dies 16 and 17 to the substrate 14. Such technologies may be also be used for adhesion as well as electrical conductivity.

According to the embodiments of the present invention, the microcontroller 18 and the capacitors 20 are attached to the interposer 12. The microcontroller 18 and capacitors 20 can be attached to the interposer 12 by epoxy, semiconductor tape, DAF, or any desirable adhesive. In one embodiment, the interposer 12 is formed from bismaleimide triazine (BT), however the interposer may be formed from silicon, ceramic, or any other suitable material. The interposer material may be selected based on cost or manufacturing requirements. A second interposer may also be used, depending on the size of the stack, the number of components, and surface area and signal routing requirements. For example, if additional components, such as another microcontroller, are required in the SIP, placement of the additional components in the vertical SIP stack may produce the same problems described above. Use of a second interposer on top of the first interposer provides the same rerouting and relocation advantages described herein with respect to the first interposer.

The microcontroller 18 has contact pads or bond pads 28 located on the periphery of the chip for electrical connection to other components in the stack. Advantageously, the microcontroller 18 and capacitors 20 may be relocated and reoriented to a preferred area on the stack 10 by employing the interposer 12. Further, the signals from the microcontroller 18 are rerouted to a more optimal bonding area, as the bond pads 28 of the microcontroller 18 are closer to the bond pads of other components and the substrate. As shown in FIG. 1, the bond pads 28 of the microcontroller 18 are connected to the bond pads 30 on the interposer 12 by bond wires 32. The interposer bond pads 30 are connected to the substrate 14 through bond wires 34 and to the memory dies 16 through bond wires 36. Without the interposer 12, the placement or orientation of the microcontroller 18 may be restricted to an area on the stack further away from the contact pads of the substrate 10 and the bond pads of the memory dies 16 and 17. Through the use of the interposer 12, the bond pads on the microcontroller 18 may be relocated or reoriented to be closer to or overlie the contact pads on the substrate 14 and the bond pads on the memory dies 16 and 17. Alternatively, the microcontroller 18 may be connected to the substrate 14, memory dies 16 and 17, or other components through the use of conductive ball technology such as FGA and BGA.

In one embodiment, the SIP stack 10 may be manufactured by assembly of two individually fabricated, tested, and assembled subassemblies. The first subassembly may include the memory dies 16 and 17 coupled to the substrate 14. The second subassembly may include the microcontroller 18 and the capacitors 20 attached to the interposer 12. Each subassembly may include any number of different components to benefit from the testing and manufacturing advantages described herein. DAF or other desirable adhesive may be applied to a sheet of interposer material prior to cutting into the interposer 12 for use in the second subassembly of the SIP stack 10, as explained below. Advantageously, the two subassemblies may be tested separately before assembly into the SIP stack 10 such that only good subassemblies are coupled together to form the stack 10. As will be appreciated, separate fabrication of the two subassemblies may reduce the unnecessary disposal of good parts and increase the reliability of the SIP stack 10.

Figure 2:
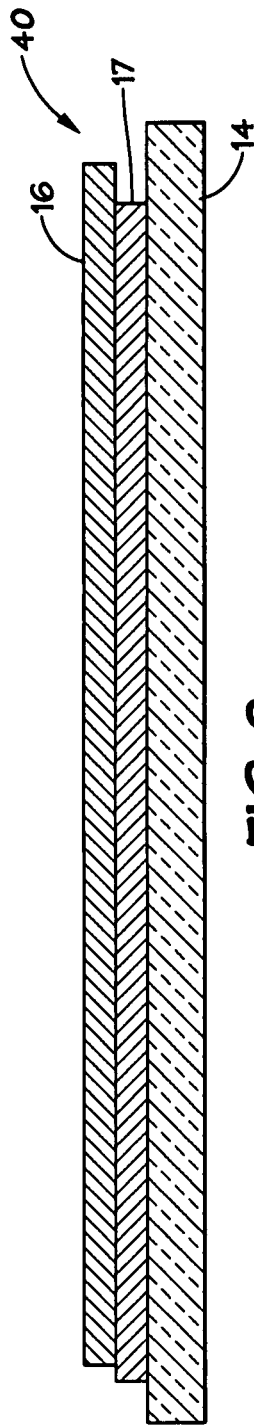
FIG. 2 illustrates a side view of a first subassembly of the SIP stack of FIG. 1 in accordance with an embodiment of the present invention.

Referring now to FIG. 2, a side view of a first subassembly 40 of the stack 10 is shown. In the illustrated embodiment, the first subassembly comprises the substrate 14, a first NAND memory die 16, and a second NAND memory die 17. Any number or types of memory dies may be stacked and coupled to the substrate 14. The NAND memory dies 16 and 17 are shown in a shingle stack configuration; however, other stack configurations may be used. As used herein, a "shingle stack" refers to components which are stacked on top of each other and wherein at least one edge of one component overhangs at least one edge of the other component. The memory dies 16 and 17 can be attached to the substrate 14 and each other by epoxy, semiconductor tape, DAF, or any desirable adhesive. Each die incorporated into the subassembly, such as memory dies 16 and 17, may be tested before assembly, and the subassembly may then be tested before coupling to a second subassembly 46, which is described with reference to FIG. 3, below.

Figure 3:
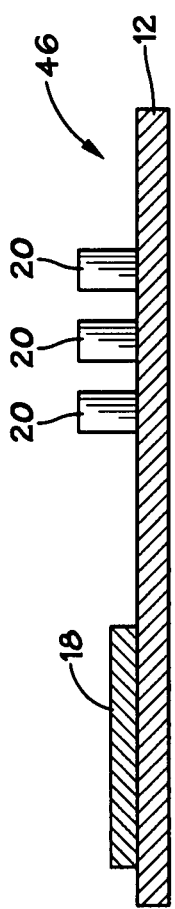
FIG. 3 illustrates a side view of a second subassembly of the SIP stack of FIG. 1 in accordance with an embodiment of the present invention.

Turning now to FIG. 3, a side view of the second subassembly 46 of the SIP stack 10 is shown. In accordance with one embodiment, the second subassembly 46 comprises a processor subassembly. In the illustrated embodiment the second subassembly comprises a BT interposer 12, a microcontroller 18, and six capacitors 20 (of which only three are visible in the side view depicted in FIG. 3). Any components for which relocation in the stack 10 or rerouting for bonding purposes is desirable may be attached to the interposer 12. The microcontroller 18 and capacitors 20 can be attached to the interposer 12 by epoxy, semiconductor tape, DAF, or any desirable adhesive. As discussed above with respect to the first subassembly, the individual components of the second subassembly 46 may be tested prior to assembly. For example, the microcontroller 18 and the capacitors 20 may be tested before attachment to the interposer 12, and after attachment, the second subassembly 46 may be tested before coupling to the first subassembly 40.

In one embodiment, attachment of the interposer 12 to the underlying dies or chips is accomplished by applying DAF to the interposer 12 according to the embodiments of the invention described herein. Before cutting the larger sheet of material from which the interposer 12 is sized and cut for incorporation into the stack, DAF is applied to a sheet of interposer material. Once DAF is applied to the interposer sheet, the interposer 12 is cut into the desired sizes. After cutting, the result of the application of DAF to the sheet of interposer material is a section of interposer cut to the appropriate size but with DAF already applied. Advantageously, in accordance with the present embodiment, after cutting, the interposer 12 is ready to be picked and placed to the desired location.

Figure 4:
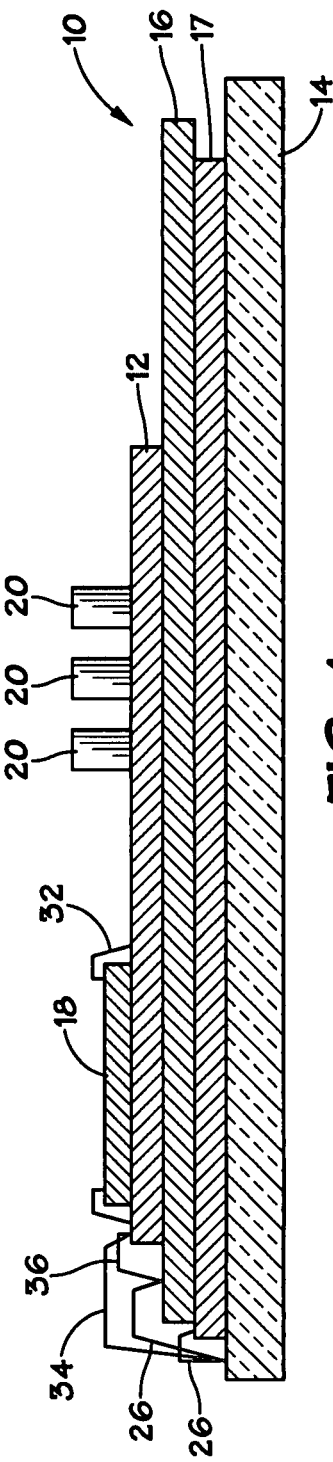
FIG. 4 illustrates a side view of the SIP stack of FIG. 1 assembled in accordance with an embodiment of the present invention.

FIG. 4 depicts a side view of the SIP stack 10 after coupling of the first subassembly 40 to the second subassembly 46. The interposer 12 at the bottom of the second subassembly is coupled to the memory dies 16 and 17 of the first subassembly 40. Further, as discussed above, the bond pads on the microcontroller 18 are connected to the bond pads on the interposer 12 through bond wires 32. The bond pads on the interposer 12 are connected to the bond pads on the memory dies 16 and 17 through the use of bond wires 36. Finally, the bond pads on the memory dies 16 and 17 are connected to the contact pads on the substrate 14 through the use of bond wires 26.

Figure 5:
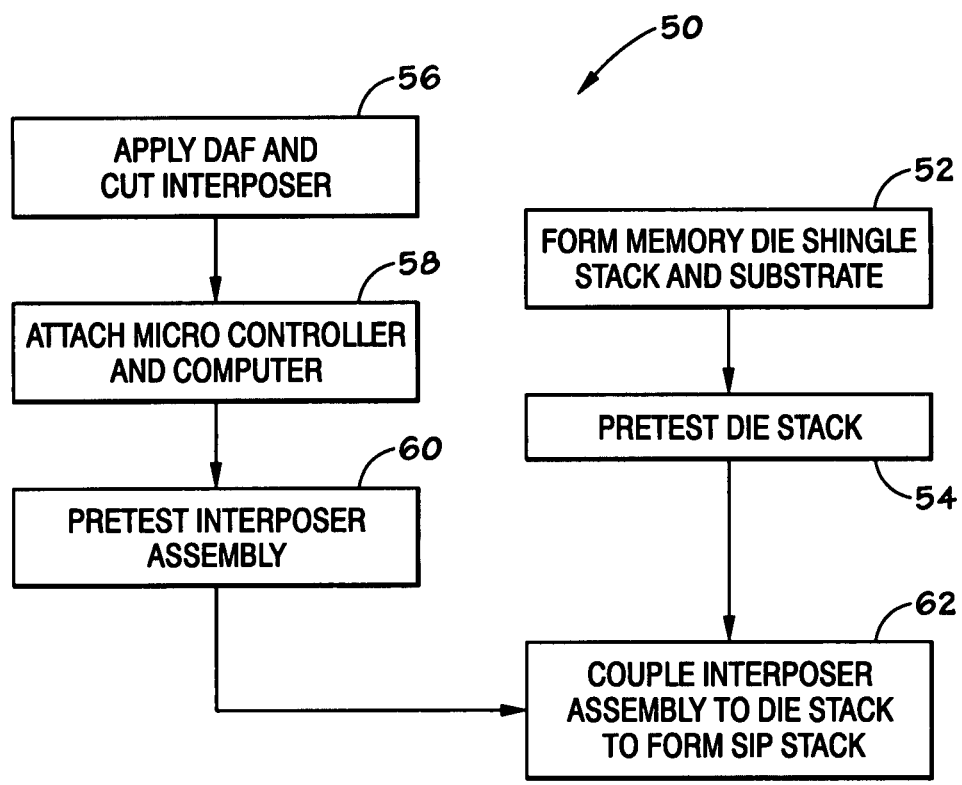
FIG. 5 illustrates a flow chart depicting the manufacturing process for the SIP stack of FIG. 1 in accordance with an embodiment of the present invention.

FIG. 5 is a flowchart illustrating one embodiment of a manufacturing process 50 used to assemble the SIP stack 10 in accordance with embodiments of the present invention. As illustrated in FIG. 5, the illustrated embodiment of the manufacturing process 50 begins with assembly of the first subassembly, here a memory subassembly, and a second subassembly, here a processor subassembly. Beginning with block 52, assembly of the memory subassembly begins by forming a memory die shingle stack using two NAND memory dies and coupling the memory die shingle stack to a substrate, as discussed above in FIG. 2. In block 54, the die stack is tested before assembly into the SIP stack. Assembly of the second subassembly, the processor subassembly, begins in block 56. In block 56, the sheet of interposer material is cut with DAF applied on the interposer sheet, as discussed above. Next, in block 58, the microcontroller and capacitors are attached to the interposer. The capacitors may be surface-mounted to the interposer. As described above with respect to the memory subassembly, in block 60 the processor subassembly is tested to ensure functionality of the subassembly and assembled components. Finally, in block 62, the processor subassembly is coupled to the memory subassembly to form the SIP stack.

By testing both the first subassembly 40 and the second subassembly 46 before assembly into the SIP stack 10, any of the components that fail testing can be discarded without wasting the other subassembly of the stack. As more semiconductor dies and chips are added into a SIP stack, the chances of component failure increases and may result in lower yields of assembled SIP's. Testing preassembled subassemblies 40 and 46 before assembly into the SIP can mitigate this problem. Further, to aid in manufacturing, the first subassemblies of the stack, for example a memory subassembly, can be fabricated as a base "generic" package. Further, the second subassemblies, such as those subassemblies with application-specific microcontrollers, can be preassembled and used with the base generic package depending on the end application.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of manufacturing a semiconductor device assembly, comprising:
   forming a first subassembly, comprising:
   providing a substrate; and
   attaching at least one semiconductor die to the substrate;
   forming a second subassembly, comprising:
   providing an interposer; and
   attaching a controller to the interposer; and
   coupling the second subassembly to the first subassembly.

2. The method of claim 1, wherein forming a second subassembly comprises attaching at least one capacitor to the interposer.

3. The method of claim 1, wherein the at least one semiconductor die comprises two NAND memory die formed in a stack.

4. The method of claim 2, wherein the stack is a shingle stack.

5. The method of claim 1, wherein providing an interposer comprises providing an interposer consisting essentially of one of bismaleimide triazine, silicon, or ceramic.

6. The method of claim 1, wherein the interposer consists essentially of bismaleimide triazine.

7. The method of claim 1, wherein the interposer consists essentially of silicon.

8. The method of claim 1, wherein the interposer consists essentially of ceramic.

9. The method of claim 1, wherein the second subassembly is attached by die attach film.

10. The method of claim 1, wherein the second subassembly is attached by epoxy.

11. The method of claim 1, comprising electrically coupling pads on the interposer to pads on the substrate via bond wires.

12. A method of fabricating a semiconductor device assembly, comprising;
   coupling at least one semiconductor die to a substrate to form a first subassembly;
   testing the first subassembly for electrical and mechanical functionality;
   coupling at least one processor to an interposer to form a second subassembly;
   testing the second subassembly for electrical and mechanical functionality; and
   coupling the first subassembly to the second subassembly.

13. The method of claim 12, comprising coupling at least one capacitor to the interposer.

14. The method of claim 12, wherein the at least one semiconductor die comprises two NAND memory die and wherein the two memory die are stacked.

15. The method of claim 14, wherein the stack is a shingle stack.

16. A method of manufacturing a semiconductor device assembly, comprising:
   forming a first assembly, comprising:
   providing a substrate; and
   coupling at least one semiconductor die on the substrate;
   forming a second assembly, comprising:
      providing an interposer wafer;
      putting adhesive on the interposer wafer;
      cutting the interposer wafer to provide an interposer with adhesive; and
      attaching a controller to the interposer; and
   coupling the second subassembly to the first subassembly.

* * * * *